(12) United States Patent
Ao

(10) Patent No.: US 7,250,760 B2
(45) Date of Patent: Jul. 31, 2007

(54) MAGNETIC SENSOR

(75) Inventor: Kenichi Ao, Tokai (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/529,320

(22) Filed: Sep. 29, 2006

(65) Prior Publication Data

US 2007/0018642 A1    Jan. 25, 2007

Related U.S. Application Data

(62) Division of application No. 10/790,040, filed on Mar. 2, 2004.

(30) Foreign Application Priority Data

Mar. 3, 2003    (JP)    ............................... 2003-55823

(51) Int. Cl.
*G01R 33/02* (2006.01)
(52) U.S. Cl. ..................................... 324/252
(58) Field of Classification Search ................. 324/252
See application file for complete search history.

(56) References Cited

U.S. PATENT DOCUMENTS 5,583,436 A    12/1996    Van De Walle et al.

FOREIGN PATENT DOCUMENTS

| JP | A-S57-147289 | 9/1982 |
|---|---|---|
| JP | A-S61-284978 | 12/1986 |
| JP | A-62-090987 | 4/1987 |
| JP | U-S62-201957 | 12/1987 |
| JP | A-H01-94684 | 4/1989 |
| JP | A-H04-284609 | 10/1992 |
| JP | A-09-079866 | 3/1997 |
| JP | H09-79865 | 3/1997 |
| JP | A-H10-270160 | 10/1998 |
| JP | A-2001-267164 | 9/2001 |

OTHER PUBLICATIONS

Notice of Official Rejection from Japanese Patent Office issued on Dec. 19, 2006 for the corresponding Japanese patent application No. 2003-055823 (a copy and English translation thereof).
Office Action from United States Patent Office issued on Nov. 22, 2006 for the corresponding U.S. Appl. No. 10/790,040 (a copy thereof).
Notification of Preliminary Rejection from Korean Patent Office issued on Sep. 23, 2005 for the corresponding Korean patent application No. 10-2004-0014089 (a copy and English translation thereof).
First Office from Chinese Patent Office issued on Nov. 4, 2005 for the corresponding Chinese patent No. 200410007404.X (a copy and English translation thereof).
Second Office Action from Chinese Patent Office issued on Apr. 21, 2006 for the corresponding Chinese patent application No. 200410007404.X (a copy and English translation thereof).

*Primary Examiner*—Reena Aurora
(74) *Attorney, Agent, or Firm*—Posz Law Group, PLC

(57) ABSTRACT

The magnetic sensor is fabricated such that a magnetic sensor chip, having a one-chip structure in which MRE bridges and a comparator are included, is mounted onto a lead frame using an adhesive material, and then the magnetic sensor chip mounted on the lead frame is encapsulated by molding in a molded material. The magnetic sensor includes a magnetic-field generating portion formed by magnetizing at least one of the chip mounting member, the adhesive material, and the encapsulating material.

1 Claim, 7 Drawing Sheets

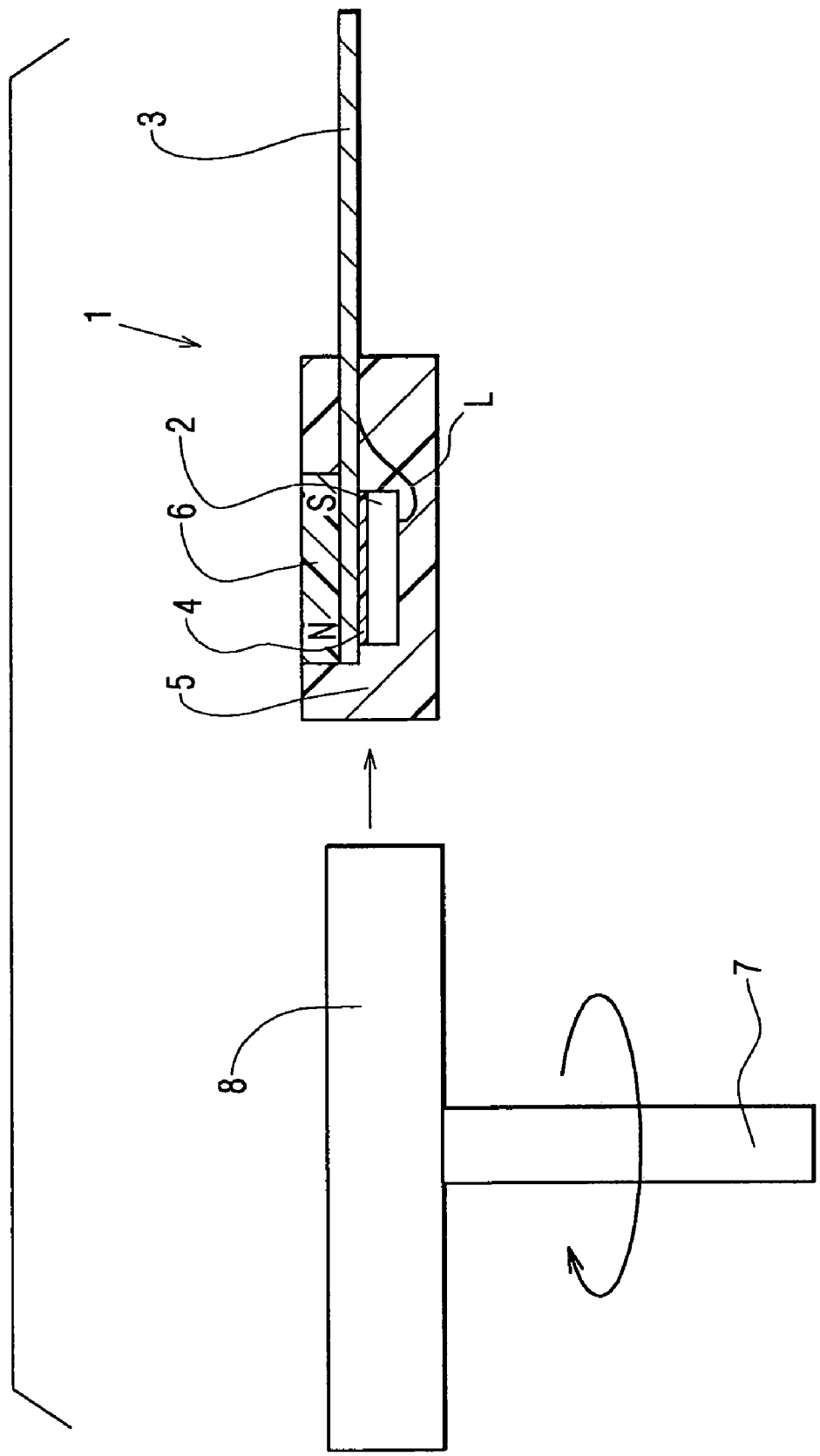

MAGNETIC SENSOR

CROSS REFERENCE TO RELATED APPLICATIONS

This application is a division of application Ser. No. 10/790,040 filed on Mar. 2, 2004. This application is also based upon, claims the benefit of priority of, and incorporates by reference Japanese Patent Application No. 2003-55823 filed Mar. 3, 2003.

BACKGROUND OF THE INVENTION

1. Field of the Invention

The present invention relates to a magnetic sensor, and more particularly, to a magnetic sensor that is employed as a rotation sensor for providing control to an automobile engine or ABS control in an automobile brake system.

2. Description of the Related Art

FIG. 10A is a cross-sectional view of the configuration of a magnetic sensor disclosed in Japanese Patent Laid-Open Publication No. Hei 91-79865 (19971), while FIG. 10B is a cross-sectional view of a modified example of FIG. 10A. As shown in FIG. 10A, a magnetic sensor 50 is fabricated in a manner such that a magnetic sensor chip 51 having a magneto-resistance element (MRE) and mounted on a lead frame 52 is packaged by molding in a molded material 53 of an epoxy-based thermosetting resin. Additionally, using an adhesive material 54, a bias magnet 55 is fixedly bonded into a recessed portion on a surface of the molded package as opposed to the magnetic sensor chip 51 mounted on the lead frame 52. A modified example shown in FIG. 10B is adapted to include the bias magnet 55 fixed onto the lead frame 52 in the molded package.

However, the conventional technique shown in FIG. 10A provides the bias magnet 55 outside the molded package, raising a problem that the magnetic sensor 50 is increased in size by the dimensions of the bias magnet 55. Furthermore, the detection accuracy of the magnetic sensor 50 depends on the positional relationship between the bias magnet 55 and the magnetic sensor chip 51. In aligning and bonding the bias magnet 55 using the adhesive material 54, the bias magnet 55 may be dislocated while the adhesive material 54 is being hardened, thereby raising another problem of providing reduced detection accuracy.

On the other hand, the bias magnet 55 may also be provided in the molded package as shown in the modified example illustrated in FIG. 10B. In this case, the magnetic sensor 50 can be reduced in size; however, the bias magnet 55 needs to be aligned with and then fixed to the lead frame 52. This raised still another problem of complicating the fabrication process as well as increasing the number of components required.

SUMMARY OF THE INVENTION

The present invention was developed in view of the aforementioned problems. It is therefore an object of the present invention to provide a magnetic sensor that is reduced in size as well as in dislocation to thereby provide improved detection accuracy, and that can be fabricated with less number of man-hours and components.

According to a first aspect of the present invention, a magnetic sensor includes a magnetic sensor chip, a chip mounting member on which the magnetic sensor chip is mounted, an adhesive material for bonding the magnetic sensor chip to the chip mounting member, an encapsulating material for encapsulating the magnetic sensor chip, and a magnetic-field generating portion formed by magnetizing at least one of the chip mounting member, the adhesive material, and the encapsulating material.

This feature enables the magnetic-field generating portion, which is otherwise provided outside the molded package, to be formed inside the molded package, thereby reducing the sensor in size by the dimensions of the magnetic-field generating portion. Furthermore, although the conventional technique uses the adhesive material to bond the magnetic-field generating portion to the molded material, the invention forms the magnetic-field generating portion by directly magnetizing at least one of the chip mounting member, the adhesive material, and the encapsulating material. This allows for eliminating dislocations while the adhesive material is being hardened, thereby providing improved detection accuracy. Furthermore, since any one of the chip mounting member, the adhesive material, and the encapsulating material can constitute the bias magnet, the number of components can be reduced when compared with the case of employing a separately prepared bias magnet.

A magnetic sensor according to a second aspect of the present invention allows the encapsulating material to be magnetized at a portion opposite to the position at which the magnetic sensor chip is -mounted. According to this feature, the magnetic-field generating portion is formed near the magnetic sensor chip, thereby allowing the magnetic force required of the magnet to be reduced.

A magnetic sensor according to a third aspect of the present invention allows the encapsulating material to be magnetized at a portion that is located on the mounting side of the magnetic sensor chip and on a side of the magnetic sensor chip. According to this feature, the magnetic-field generating portion can be provided closer to the magnetic sensor chip, thereby allowing the magnetic force required of the magnet to be further reduced.

A magnetic sensor according to a fourth aspect of the present invention allows the chip mounting member to be magnetized at a portion on which the magnetic sensor chip is mounted. According to this feature, since the chip mounting member is employed as the magnetic-field generating portion, the conventionally employed lead frame can also be used to form the magnetic-field generating portion, thereby facilitating fabrication.

A magnetic sensor according to a fifth aspect of the present invention allows the adhesive material to be formed on a surface on which the magnetic sensor chip is mounted as well as to be entirely magnetized. According to this feature, the magnetic-field generating portion can be provided closer to the magnetic sensor chip, thereby allowing the magnetic force required of the magnet to be reduced.

A magnetic sensor according to a sixth aspect of the present invention includes a magnetic sensor chip; a chip mounting member, for mounting the magnetic sensor chip thereon, with a magnetized portion on which the magnetic sensor chip is mounted; a magnetized adhesive material for boding the magnetic sensor chip to the chip mounting member; and an encapsulating material for encapsulating the magnetic sensor chip therein, the encapsulating material having a magnetized portion on a surface opposite to the mounting surface of the magnetic sensor chip on the chip mounting member, the magnetized portion of the encapsulating material corresponding to the magnetized portion of the chip mounting member. According to this feature, since the member formed on the reverse side of the magnetic sensor chip mounted portion serves as the magnetic-field generating portion, the magnetic-field generating portion is increased in volume, thereby allowing the bias magnet to create an increased magnetic force.

A method for fabricating the magnetic sensor according to any one of the first to sixth aspects corresponds to one of the seventh to thirteenth aspects of the present invention except for the tenth aspect below. The method can provide the same operation and effects as those described above with reference to the first to sixth aspects, which will not be explained again.

In a method for fabricating a magnetic sensor according to the tenth aspect of the invention, the magnetic sensor is provided with a chip mounting member having a predetermined portion reduced in shape relative to its peripheral portion to make the predetermined portion highly resistive. The method further entails the step of allowing a large current to flow through the chip mounting member while externally applying a magnetic field to the encapsulated magnetic sensor chip, thereby generating heat at the portion reduced in shape of the chip mounting member to magnetize the vicinity of the portion reduced in shape. According to this feature, a desired position inside the encapsulating material can be magnetized.

In a method for fabricating a magnetic sensor according to a fourteenth aspect of the invention, the magnetized portion is demagnetized once and magnetized again. According to this feature, even when a dislocation is found after the desired portion is aligned and magnetized, the demagnetization allows re-alignment.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 1 is a cross-sectional view of the arrangement of a magnetic sensor and a magnetic rotor according to a first embodiment of the present invention;

DETAILED DESCRIPTION OF THE PREFERRED EMBODIMENTS

The following description of the preferred embodiments is merely exemplary in nature and is in no way intended to limit the invention, its application, or uses.

First Embodiment

Figure 2A:
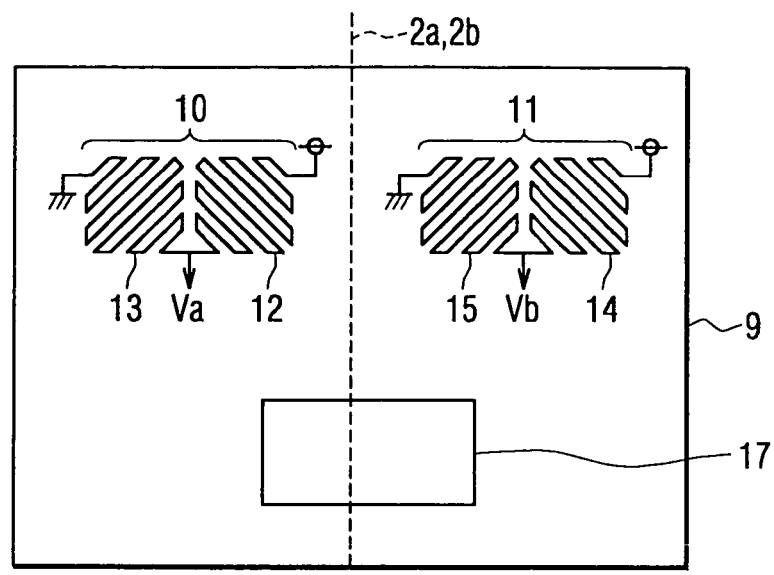
FIG. 2A is a plan view of a magnetic sensor chip according to an embodiment of the present invention.
Figure 2B:
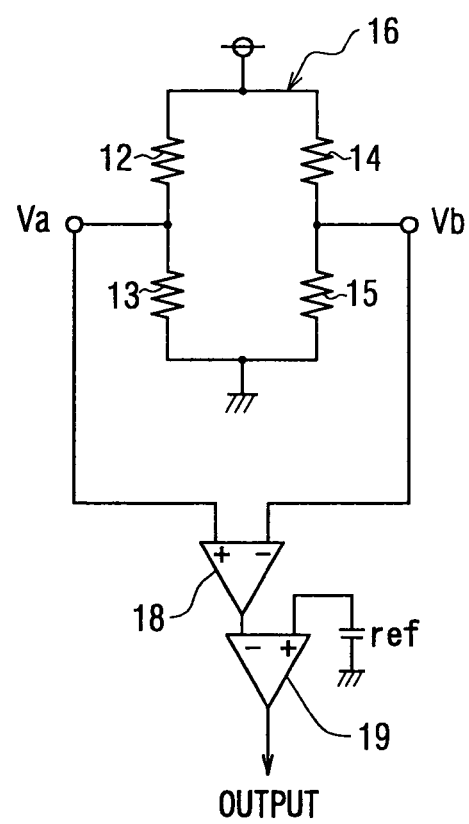
FIG. 2B is a circuit diagram of the arrangement of MRE bridges according to the first embodiment of the present invention.

Now, the present invention will be described with reference to the accompanying drawings in accordance with a magnetic sensor according to a first embodiment. FIG. 1 is a cross-sectional view of a magnetic sensor and a magnetic rotor (an object to be detected) according to the first embodiment of the present invention. FIG. 2A is a plan view of the magnetic sensor chip according to the first embodiment of the present invention, while FIG. 2B is a circuit diagram of the circuit configuration of a magnetoresistive pattern according to the first embodiment of the present invention.

This embodiment provides a magnetic sensor 1 which can be employed as a rotation detector, for detecting the rotation of a rotating object (including gears) to be sensed, such as an engine rotation sensor, a cam angle sensor, a crank angle sensor, an automobile speed sensor, an AT sensor, and a wheel speed sensor. Referring to FIG. 1, on the right hand side of a gear-shaped (its teeth not shown) magnetic rotor (an object to be detected) 8, the magnetic sensor 1 is disposed opposite to the magnetic rotor 8 at a certain distance therefrom. The magnetic rotor 8 is coupled to a spinning body (not shown) via a rotary shaft 7. The magnetic sensor 1 includes a magnetic sensor chip 2, a lead frame 3, and a molded material 5. A portion of the molded material 5 is magnetized to serve as a bias magnet 6 for producing a bias magnetic field.

As shown in FIG. 2A, the magnetic sensor chip 2 has a one-chip structure that includes a substrate 9 on which MRE bridges 10, 11 and a processing circuit 17 are formed. The MRE bridges 10, 11 include MREs 12-15, while the processing circuit 17 includes a differential amplifier 18, a comparator 19 and the like, which are known in the art. The centerline 2a of the magnetic sensor chip 2 lies on the magnetic center 2b of a magnetic field produced by the bias magnet 6. The MRE bridges 10, 11 are disposed symmetrically about the chip centerline 2a. Furthermore, each of the MRE bridges 10, 11 has a comb-shaped structure that is formed by sequentially folding back a conductor trace to alternately define a plurality of longer and shorter sides for connection.

The MREs 12 to 15 are constructed such that the MREs 12, 13 are connected in series, the MREs 14, 15 being also connected in series, and the MREs 12, 14 on the power supply side and the MREs 13, 15 on the ground side are disposed symmetrically about the centerline 2a of the magnetic sensor chip 2. The MREs 12, 13 and MREs 14, 15, each having a serial connection, are arranged such that their detection axes form an angle of 45 and −45 degrees to the magnetic center 2b of the magnetic field produced by the bias magnet 6, respectively, i.e., the detection axes form an angle of 90 degrees to each other as in the shape of a Japanese character "HAz((ハ))". This allows a vectorial variation in bias magnetic field to result in increased variations in potential at the two middle points between the serially connected MREs, 12 and 13 and between the serially connected MREs 14 and 15.

As shown in FIG. 2B, the first and second MRE bridges 10, 11 form a bridge circuit 16 in which the first MRE bridge 10 allows current to flow from the MRE 12 toward the MRE 13, while the second MRE bridge 11 allows current to flow from the MRE 14 toward the MRE 15. The bridge circuit 16 employs a midpoint potential Va between the MREs 12 and 13 as the output from the MRE bridge 10, while employing a midpoint potential Vb between the MREs 14 and 15 as the output from the MRE bridge 11.

The magnetic sensor 1 constructed as described above operates as follows. First, the magnetic rotor 8 rotating in a given direction causes its peripheral crests (protruded portions) and valleys (recessed portions) to alternately approach the bias magnet 6. This causes a bias magnetic field produced by the bias magnet 6 to be attracted by the protruded portion and thereby varied. At this time, the magnetic vector passing through the MREs 12 to 15 is deflected in the direction of rotation of the magnetic rotor 8, thereby causing variations in resistance of the MREs 12 to 15 due to the change in the direction of the magnetic vector. This leads to variations in outputs Va, Vb from the two pairs of the MRE bridges 10 and 11.

These outputs Va, Vb are supplied to the differential amplifier 18 incorporated into the processing circuit 17. The differential amplifier 18 differentially amplifies the midpoint potentials Va, Vb from the two MRE bridges 10, 11 for output. A signal amplified by the differential amplifier 18 and then supplied to the comparator 19 is binary coded through a magnitude comparison with a predetermined threshold voltage. This makes it possible to employ the output from the processing circuit 17 as the output from the magnetic sensor 1, thereby detecting the rotational state of the magnetic rotor 8.

Figure 3A:
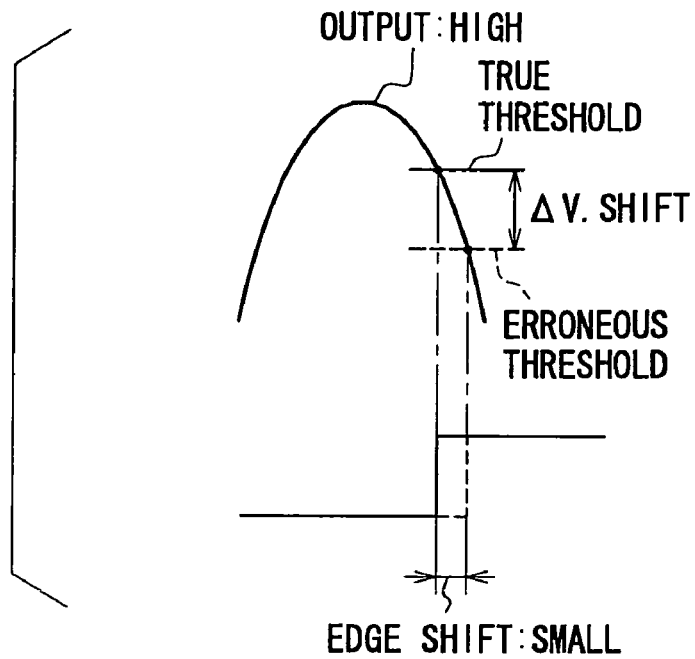
FIG. 3A is a characteristic diagram of the characteristics of the MRE bridges placed in proper alignment with a bias magnet according to an embodiment of the present invention.
Figure 3B:
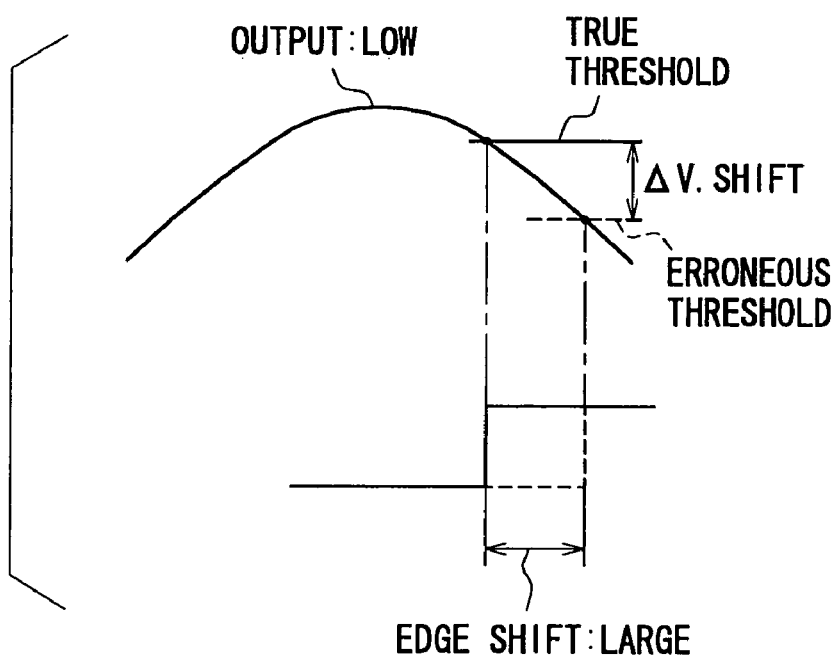
FIG. 3B is a characteristic diagram of the characteristics of the MRE bridges placed in improper alignment with the bias magnet.

The binary coding of sensor outputs carried out in the differential amplifier 18 or the like to provide binary output raises a problem of the amount of shift in the rising and falling edges of the binary output, the amount of shift in the edges having an effect on the detection accuracy of sensors. One of the factors having an effect on the shift in the edges is the positional relation between the MRE bridges 10, 11 and the bias magnet 6. FIG. 3A is a characteristic diagram of the MRE bridges 10, 11 placed in proper alignment with the bias magnet 6. FIG. 3B is a characteristic diagram of the MRE bridges 10, 11 placed in improper alignment with the bias magnet 6.

As shown in FIGS. 3A and 3B, the sensor output varies due to a dislocation of the bias magnet 6 relative to the MRE bridges 10, 11 when a sinusoidal sensor output signal (amplified signal) is translated into a binary coded signal using the predetermined threshold value. This variation in the sensor output may cause an actual threshold value to deviate from the true threshold value, e.g., by a predetermined potential difference $\Delta V$ (mV) (an erroneous threshold value). This deviation in the threshold value causes a shift in the position of the rising and falling edges when compared with the case of binary coding using the true threshold value.

As shown in FIG. 3A, with the MRE bridges 10, 11 kept in proper alignment with the bias magnet 6, the sensor output has a large magnitude for the deflection of the magnetic vector with the output signal having a steep gradient. Accordingly, a binary coded signal (pulsed signal) is reduced in the amount of shift at its edge position, thereby providing a desired level of detection sensitivity. However, as shown in FIG. 3B, with the MRE bridges 10, 11 placed in improper alignment with the bias magnet 6, the sensor output has a small magnitude for the deflection of the magnetic vector with the output signal having a slanted gradient. This causes an increase in the amount of edge shift and a drop in the level of detection sensitivity, even when the amount of threshold shift $\Delta V$ is the same as that of the case of FIG. 3A.

Figure 4A:
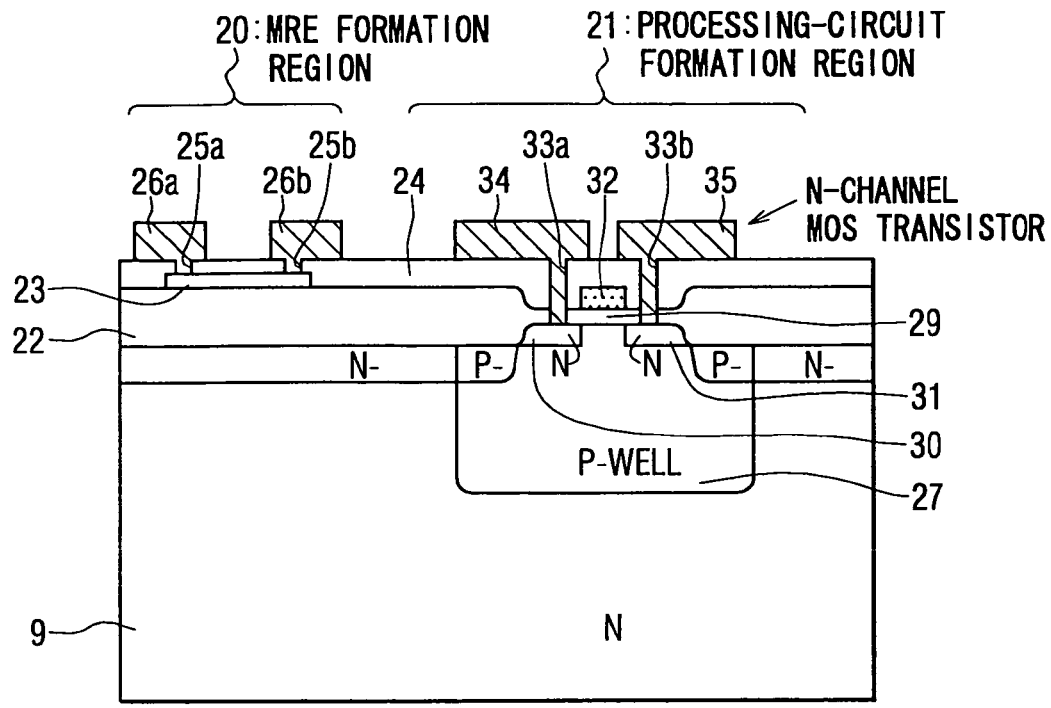
FIG. 4A is a cross-sectional view of a one-chip structure of an MRE formation region and a processing-circuit formation region made up of a MOSFET or the like, in the magnetic sensor chip according to an embodiment of the present invention.
Figure 4B:
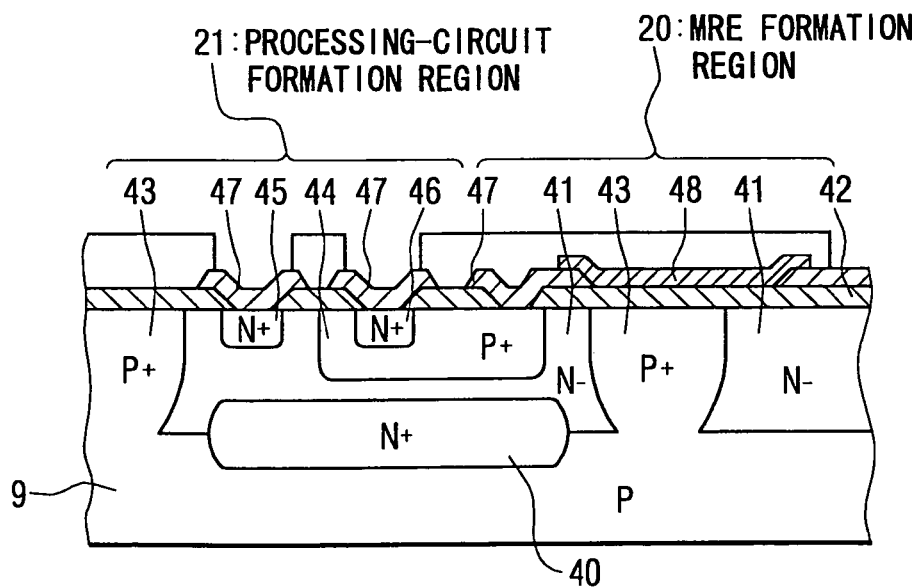
FIG. 4B is a cross-sectional view of a one-chip structure of the MRE formation region and a processing-circuit formation region made up of a bipolar transistor or the like, in the magnetic sensor chip.

Now, a method for fabricating the magnetic sensor 1 will be explained below. FIGS. 4A and 4B are cross-sectional views of the magnetic sensor chip 2 having a one-chip structure. First, as shown in FIG. 4A, such a case is described in which an MRE formation region 20 and a processing-circuit formation region 21 including a MOSFET and the like are formed in a one-chip structure. In the magnetic sensor chip 2, the substrate 9 is made of silicon. The MRE formation region 20 in the magnetic sensor chip 2 has a LOCOS oxide film 22 deposited on the N-type silicon substrate 9, with a ferromagnetic thin film 23, formed such as of a Ni—Co alloy or Ni—Fe alloy, deposited as an MRE on the LOCOS oxide film 22 by the known vacuum deposition. On the ferromagnetic thin film 23, there is formed a silicon oxide film 24. The ferromagnetic thin film 23 is connected to aluminum conductor trace materials 26a, 26b through contact holes 25a, 25b.

The processing-circuit formation region 21 has a P-well region 27 formed at a surface layer portion of the N-type silicon substrate 9. On top of the P-well region 27, not the LOCOS oxide film 22 but a thin gate silicon oxide film 29 is formed. On the gate silicon oxide film 29, there is formed a polysilicon gate electrode 32. On a surface layer portion of the P-well region 27 at both the sides of the polysilicon gate electrode 32, there are formed an N-type source region 30 and an N-type drain region 31, which are connected to aluminum conductor trace materials 34, 35 through contact holes 33a, 33b. In this manner, an N-channel MOS transistor Tr is formed, which in conjunction with a resistor (not shown) or the like, forms an operational amplifier (the amplifier 18). It is also possible to form a gain-determining feedback resistor, a gain-determining input resistor or the like in the MOS process.

Now, as shown in FIG. 4B, such a case is described in which the MRE formation region 20 and the processing-circuit formation region 21 including a bipolar transistor or the like is formed in a one-chip structure. For the processing-circuit formation region 21, there are formed an N× embedded layer 40 and an N− epitaxial layer 41 on the principal surface of the silicon substrate 9. On the principal surface of the N− epitaxial layer 41, a silicon oxide film 42 is deposited using CVD equipment. Then, the silicon oxide film 42 is photo-etched using a desired circuit pattern and then doped to form a P+ device isolation region 43, a P+ diffusion region 44, and N+diffusion regions 45, 46. In this manner, an NPN bipolar transistor is made up of the N+ embedded layer 40, the N− epitaxial layer 41, the P+ diffusion region 44, and the N+ diffusion regions 45, 46.

Then, in the MRE formation region 20, a contact portion is formed on the silicon oxide film 42. A thin-film aluminum conductor trace material 47 is evaporated onto the principal surface of the P-type semiconductor substrate 9 and then photo-etched for patterning. Additionally, on the silicon oxide film 42 including the aluminum conductor trace material 47, a ferromagnetic thin film 48, formed such as of a Ni—Co alloy or Ni—Fe alloy, is deposited as an MRE by the known vacuum deposition. The NPN transistor formed on the principal surface of the P-type semiconductor substrate 9 and circuit components (not shown) such as a PNP transistor, a diffusion resistor, and a capacitor are electrically connected using the aluminum conductor trace material 47 to serve as an electric circuit.

The magnetic sensor chip 2 formed in this manner is placed at a desired position on the lead frame 3 to be mounted thereon with an adhesive material 4, and then electrically connected to the lead frame 3 with a lead wire L. The lead frame 3 having the magnetic sensor chip 2 mounted thereon is then put in place within a mold having a predetermined shape to be encapsulated by molding in the molded material 5. Thereafter, a predetermined portion of the molded material 5 is magnetized to thereby form the bias magnet 6. At this time, a heat-resistant resin such as PPS (polyphenylene sulfide) mixed with magnetic powder such as ferrite is employed as the molded material 5.

Now, the bias magnet 6 will be explained in more detail. The molded material 5 is magnetized using a large current with the magnetic sensor 1 placed in a predetermined gap of a magnetized yoke formed in the shape of a toroidal core in order to instantaneously establish a magnetic field greater than or equal to $1 \times 10^6$ (A/m) in the gap. On the other hand, as described above, the positional relation between the bias magnet 6 and the MRE bridges 10, 11 is one of the factors having an effect on the detection accuracy of the sensor. Accordingly, it is necessary to magnetize the bias magnet 6 in optimal alignment with the MRE bridges 10, 11.

The optimal alignment can be achieved as follows. The magnetic characteristics of the MREs 12 to 15 constituting the MRE bridges 10, 11 exhibit the maximum resistance when a magnetic field is applied in the direction of the longer sides of the comb-shaped MRE pattern, and the minimum resistance when a magnetic field is applied in the direction of the shorter sides. This means that with the magnetic field being rotated, a large change in MRE resistance is obtained most efficiency at an angle of 45 degrees between the direction of the bias magnetic field and the MRE pattern. Therefore, the bias magnet 6 is positioned so that the bias magnetic field is inclined for biasing at an angle of 45 degrees to the MREs 12 to 15. Incidentally, the detection device is not limited to the MRE, but a barber pole may also be employed.

Figure 5:
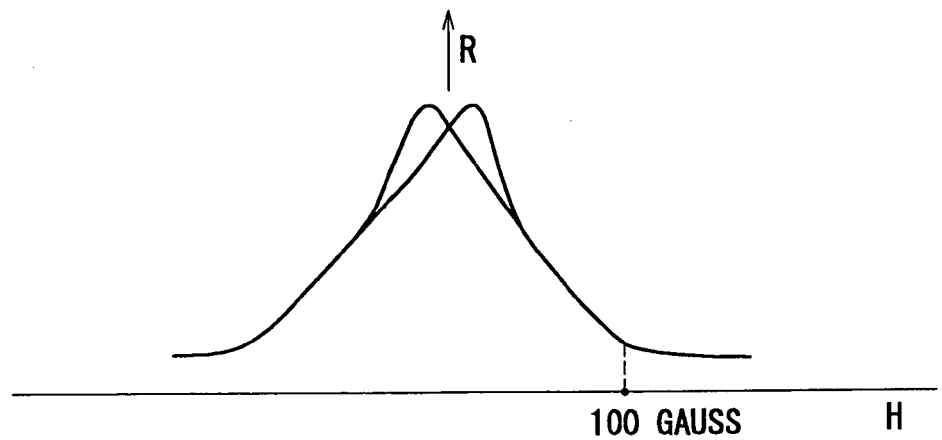
FIG. 5 is a diagram of the characteristics of the relation between the magnetic force and the variation in resistance of an MRE bias magnet.

Furthermore, concerning the magnetic field strength of the bias magnet 6, FIG. 5 shows a characteristic diagram of the relation between the magnetic field strength and the variation in resistance of the MRE bias magnet. As shown in FIG. 5, the MRE has an output resistance exhibiting a hysteresis property. Accordingly, to use it as the magnetic sensor, a magnetic field strength in the region in which the output resistance is saturated (about 100 Gauss or more) in consideration of reproducibility. On the other hand, the magnetic field strength is greater with longer distances between the S and N poles, and with greater permeance of the magnet.

As described above, this embodiment allows the magnetic-field generating portion, which is conventionally provided outside the mold package, to be formed within the mold package, thereby reducing the size of the sensor by the dimensions of the magnetic-field generating portion. Furthermore, although the magnetic-field generating portion is bonded to the molded material with an adhesive material in the prior art, this embodiment allows the magnetic-field generating portion to be formed by directly magnetizing at least one of the chip mounting member, the adhesive material, and encapsulating material. This eliminates dislocations that would otherwise occur when the adhesive material is hardened, thereby making it possible to provide improved detection accuracy. Furthermore, since the bias magnet is made up of any one of the chip mounting member, the adhesive material, and the encapsulating material, it is possible to reduce the number of components when compared with the case of employing a separately prepared bias magnet.

Second Embodiment

Figure 6:
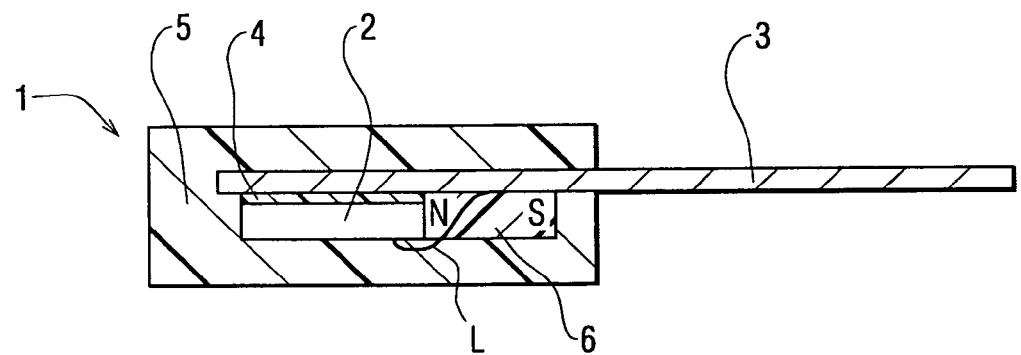
FIG. 6A, FIG. 6B and FIG. 6C are views including a cross-sectional view and plan views of the structure of a magnetic sensor according to a second embodiment of the present invention.
Figure 6A:
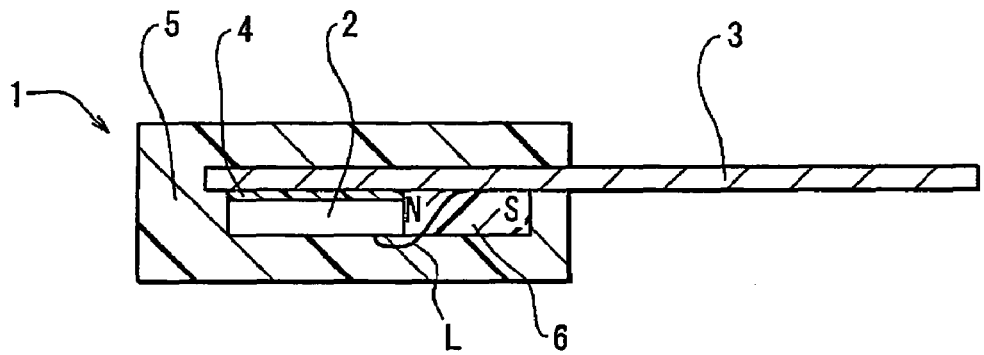
Figure 6B:
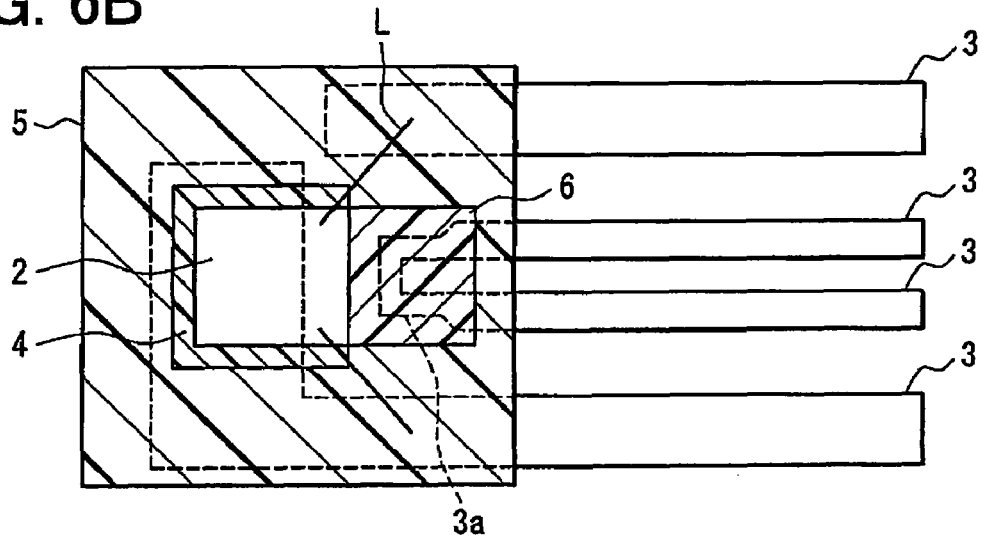
Figure 6C:
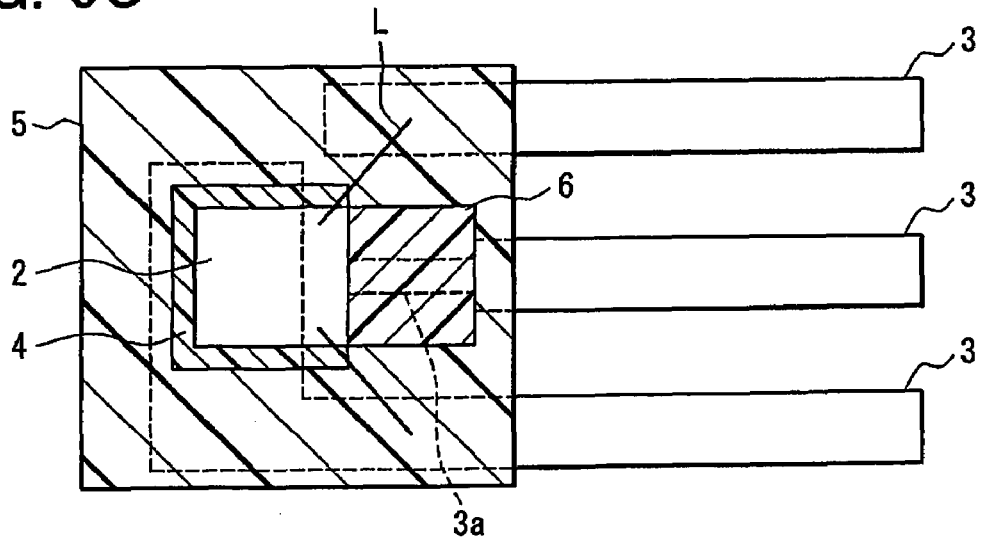

Now, the present invention will be explained with reference to FIG. 6A, FIG. 6B and FIG. 6C, in accordance with a second embodiment. The portions of the second embodiment common to those of the first embodiment are not to be explained in detail. This embodiment is different from the first embodiment in that the bias magnet 6 is formed at a portion on a side of the magnetic sensor chip 2.

A method according to this embodiment makes use of the property that a magnetic material is less magnetized when its Curie temperature is reached, thereby being readily affected externally. To reach the Curie temperature, the lead frame 3 is provided with a heat-generating portion 3a, which is part of the lead frame 3 reduced in shape to have an increased resistance and generates heat by a large current flowing therethrough. This heat-generating portion 3a is formed, within the lead frame 3, near the optimal position at which the aforementioned bias magnet 6 is desirably formed as shown, for example, in FIGS. 6A, 6B and 6G.

First, as in the first embodiment, the magnetic sensor chip 2 is placed at a desired position on the lead frame 3 to be mounted thereon with the adhesive material 4, and then electrically connected to the lead frame 3 with the lead wire L. The magnetic sensor chip 2 mounted on the lead frame 3 is then encapsulated by molding in the molded material 5 of a heat-resistant resin such as PPS (polyphenylene sulfide) mixed with magnetic powder such as ferrite. Thereafter, a large current is allowed to instantaneously flow through the lead frame 3 while a magnetic field is being applied to the magnetic sensor 1 that has been encapsulated by molding. This causes the heat-generating portion 3a of the lead frame 3 to generate heat and the temperature of the molded material 5 present near the heat-generating portion 3a to increase. This further causes the molded material 5 present near the heat-generating portion 3a to be magnetized, thereby forming the bias magnet 6.

As described above, this embodiment allows the bias magnet 6 to be formed near the magnetic sensor chip 2, thereby allowing the magnetic force required of the magnet to be reduced. Furthermore, the lead frame 3 having the heat-generating portion 3a according to this embodiment allows for forming the bias magnet 6 at a desired position inside the molded material.

Third Embodiment

Figure 7:
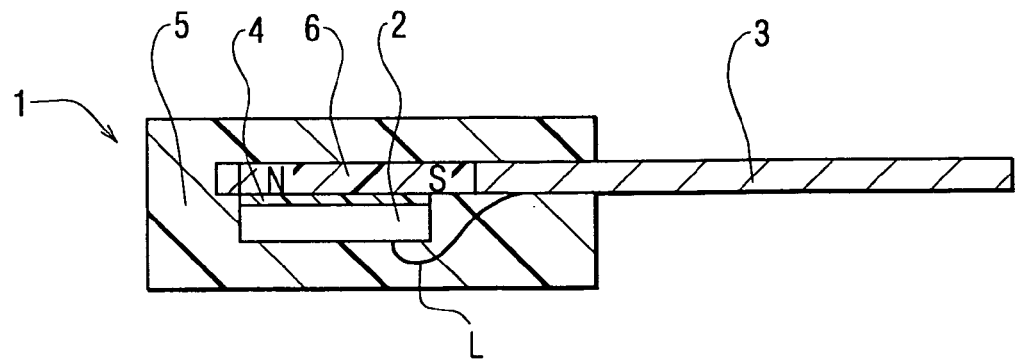
FIG. 7 is a cross-sectional view of the structure of a magnetic sensor according to a third embodiment of the present invention.

Now, the present invention is explained with reference to FIG. 7 in accordance with a third embodiment. The portions of the third embodiment common to those of the aforementioned embodiments will not be explained in detail. This embodiment is different from the aforementioned embodiments in that the bias magnet 6 is formed in the lead frame 3.

A method according to this embodiment includes the step of using a magnetized yoke to magnetize the optimal position desired to form the aforementioned bias magnet 6 in the lead frame 3 made of known copper or b 42Ni—Fe or the like, thereby forming the bias magnet 6. In this manner, the lead frame 3 is employed as the bias magnet 6. Thus, a conventionally available lead frame 3 can be used to form the bias magnet 6 without mixing magnetic powder into the molded material 5, thereby facilitating manufacture.

Fourth Embodiment

Figure 8:
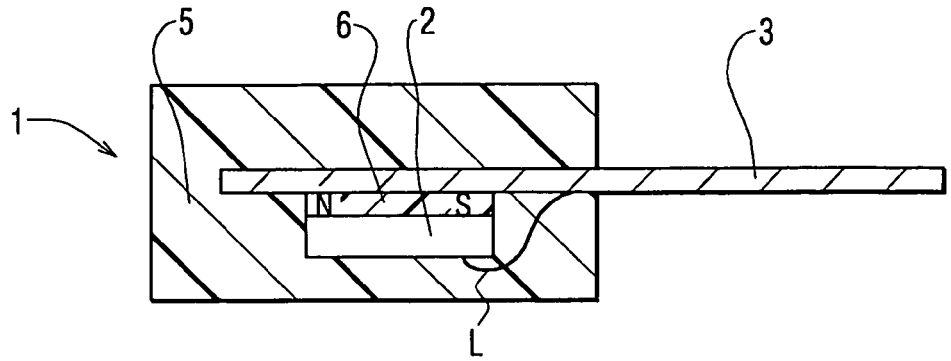
FIG. 8 is a cross-sectional view of the structure of a magnetic sensor according to a fourth embodiment of the present invention.

Now, the present invention will be explained with reference to FIG. 8 in accordance with a fourth embodiment. The portions of the fourth embodiment common to those of the aforementioned embodiments will not be explained in detail. This embodiment is different from the aforementioned embodiments in that the bias magnet 6 is formed in the adhesive material 4. A method according to this embodiment includes the steps of mixing magnetic powder such as ferrite into a known epoxy-based, silicone-based, or polyimide-based adhesive material, and using a magnetized yoke to magnetize the optimal position desired to form the aforementioned bias magnet 6 in the adhesive material 4, thereby forming the bias magnet 6. In this manner, the adhesive material 4 is employed as the bias magnet 6. This allows for forming the bias magnet 6 close to the magnetic sensor chip 2, thereby making it possible to reduce the magnetic force required of the magnet.

Fifth Embodiment

Figure 9:
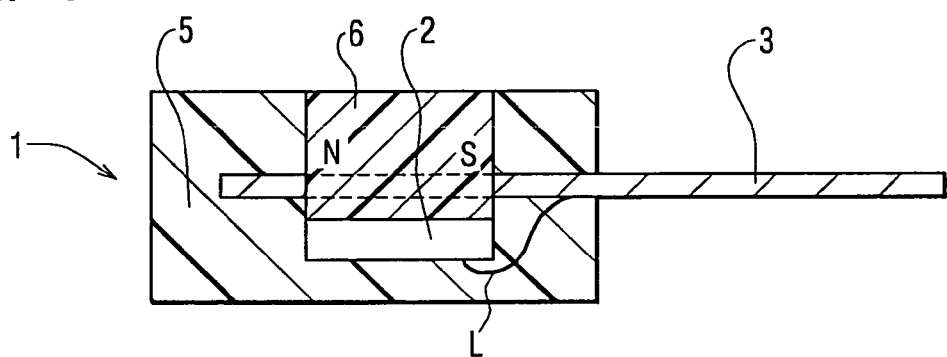
FIG. 9 is a cross-sectional view of the structure of a magnetic sensor according to a fifth embodiment of the present invention.
Figure 10A:
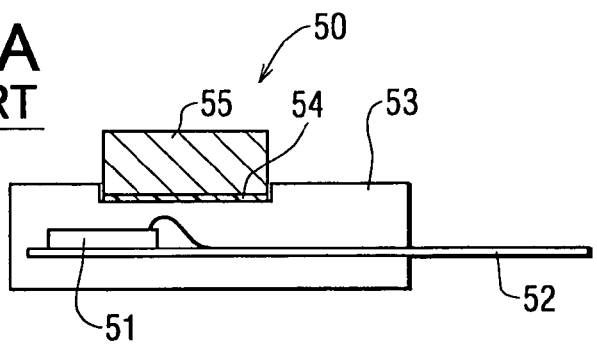
FIG. 10A is a cross-sectional view of the structure of a magnetic sensor according to the prior art.
Figure 10B:
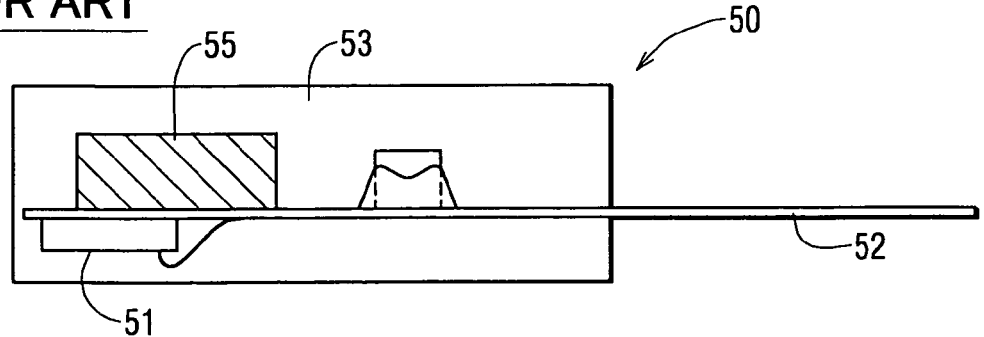
FIG. 10B is a cross-sectional view of a modified example of FIG. 10A of the prior art.

Now, the present invention is explained with reference to FIG. 9 in accordance with a fifth embodiment. The portions of the fifth embodiment common to those of the aforementioned embodiments are not to be explained in detail. This embodiment is different from the aforementioned embodiments in that the bias magnet 6 is formed in all of the adhesive material 4, the lead frame 3, and the molded material 5.

A method according to this embodiment is implemented as follows. First, the adhesive material 4 prepared as described in the fourth embodiment is applied onto the lead frame 3 that is formed as described in the third embodiment, and then the magnetic sensor chip 2 is mounted thereon using the adhesive material 4. Then, the magnetic sensor chip 2 mounted on the lead frame 3 is encapsulated by molding in the molded material 5 as described in the first embodiment. Additionally, as described in the first embodiment, the magnetized yoke is used to magnetize the desired portion, thereby forming the bias magnet.

In this manner, the predetermined portion in the adhesive material 4, the lead frame 3, and the molded material 5, which are present on the reverse side of the magnetic sensor chip 2, serves as the bias magnet 6. This makes it possible to increase the volume of the bias magnet 6, thereby allowing the bias magnet 6 to provide an increased magnetic field.

The present invention is not limited to magnetizing all of the lead frame 3, the adhesive material 4, and the molded material 5, as described above. Some of these components can also be combined to be magnetized, e.g., such that the lead frame 3 and the adhesive material 4, or the adhesive material 4 and the molded material 5 are magnetized. As a modified example, the bias magnet 6 that has been once magnetized as described above can be demagnetized. This demagnetization allows the bias magnet 6 to be re-positioned even when dislocated after having been aligned for the magnetization.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A magnetic sensor comprising:
   a magnetic sensor chip;
   a chip mounting member on which the magnetic sensor chip is mounted;
   an adhesive material for bonding the magnetic sensor chip to the chip mounting member;
   an encapsulating material for encapsulating the magnetic sensor chip; and
   a magnetic-field generating portion formed by magnetizing the encapsulating material,
   wherein the encapsulating material is made of a mixture of heat-resistant resin and magnetic powder, and
   wherein the chip mounting member includes a heat-generating portion, the heat generating portion including a part of the chip mounting member reduced in shape so as to have an increased resistance, the heat-generating portion generating heat when current is supplied to the chip mounting member when magnetizing the encapsulating material.

* * * * *